(12) United States Patent
Gan et al.

(10) Patent No.: US 6,524,651 B2
(45) Date of Patent: Feb. 25, 2003

(54) OXIDIZED FILM STRUCTURE AND METHOD OF MAKING EPITAXIAL METAL OXIDE STRUCTURE

(75) Inventors: Shupan Gan, Richland, WA (US); Yong Liang, Richland, WA (US)

(73) Assignee: Battelle Memorial Institute, Richland, WA (US)

(*) Notice: Subject to any disclaimer, the term of this patent is extended or adjusted under 35 U.S.C. 154(b) by 0 days.

(21) Appl. No.: 09/770,784

(22) Filed: Jan. 26, 2001

(65) Prior Publication Data

US 2002/0102418 A1 Aug. 1, 2002

(51) Int. Cl.$^7$ ............................................... C23C 16/40
(52) U.S. Cl. ........................... 427/255.27; 427/255.31; 427/255.32; 427/255.4; 117/103; 117/108; 117/939; 117/944
(58) Field of Search ........................... 427/255.27, 255, 427/31, 255.32, 255.4; 117/103, 108, 939, 944

(56) References Cited

U.S. PATENT DOCUMENTS

| 5,225,031 A | * | 7/1993 | McKee et al. | |
|---|---|---|---|---|
| 5,482,003 A | | 1/1996 | McKee et al. | 117/108 |
| 6,022,410 A | | 2/2000 | Yu et al. | 117/103 |
| 6,113,690 A | | 9/2000 | Yu et al. | 117/84 |

OTHER PUBLICATIONS

K Eisenbeiser et al., "Field Effect Transistors with $SrTiO_3$ Gate Dielectric on Si", pp. 1324–1326. 2000.

RA McKee et al., "Molecular Beam Epitaxy Growth of Epitaxial Barium Silicide, Barium Oxide, and Barium Titanate on Silicon", p. 782–784. 1991.

RA McKee et al., "$BaSi_2$ and Thin Film Alkaline Earth Silicides on Silicon", p. 2818–2820. 1993.

RA McKee et al., "Crystalline Oxides on Silicon: The First Five Monolayers", pp. 3014–3017. 1998.

Z Yu et al., "Properties of Epitaxial $SrTiO3$ Thin Films Grown on Silicon by Molecular Beam Epitaxy", p. 427–433. 1999.

Z Yu et al., "Epitaxial Oxide Thin Films on Si(001)", p. 2139–2145. 2000.

* cited by examiner

Primary Examiner—Timothy Meeks
(74) Attorney, Agent, or Firm—Stephen R. May; Douglas E. McKinley

(57) ABSTRACT

A stable oxidized structure and an improved method of making such a structure, including an improved method of making an interfacial template for growing a crystalline metal oxide structure, are disclosed. The improved method comprises the steps of providing a substrate with a clean surface and depositing a metal on the surface at a high temperature under a vacuum to form a metal-substrate compound layer on the surface with a thickness of less than one monolayer. The compound layer is then oxidized by exposing the compound layer to essentially oxygen at a low partial pressure and low temperature. The method may further comprise the step of annealing the surface while under a vacuum to further stabilize the oxidized film structure. A crystalline metal oxide structure may be subsequently epitaxially grown by using the oxidized film structure as an interfacial template and depositing on the interfacial template at least one layer of a crystalline metal oxide.

12 Claims, 4 Drawing Sheets

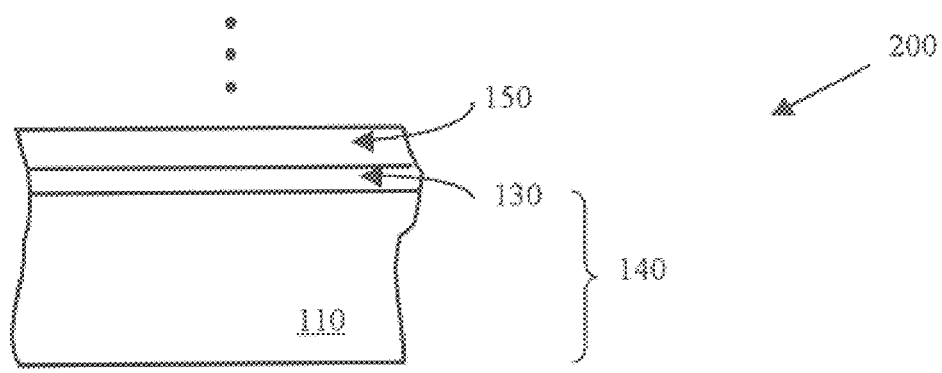
FIG. 2
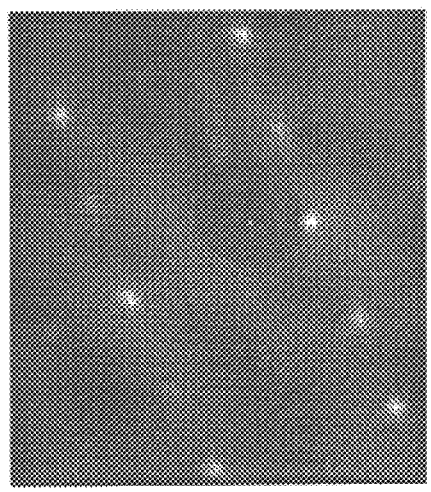 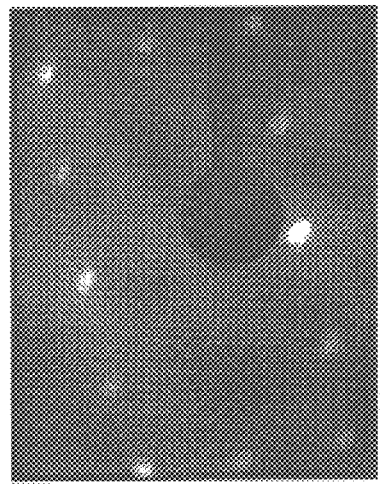
FIG. 3a          FIG. 3b

OXIDIZED FILM STRUCTURE AND METHOD OF MAKING EPITAXIAL METAL OXIDE STRUCTURE

STATEMENT REGARDING FEDERALLY SPONSORED RESEARCH OR DEVELOPMENT

This invention was made with Government support under Contract DE-AC0676RL01830 awarded by the U.S. Department of Energy. The Government has certain rights in the invention.

FIELD OF THE INVENTION

This invention relates to oxidized film structures, including crystalline metal oxides epitaxially grown on such structures for electronic, optical, and magnetic applications.

DESCRIPTION OF RELATED ART

New epitaxial metal oxide thin film microstructures on substrates such as silicon could offer a variety of improved properties that are necessary in future microelectronics, including improved dielectric, optical, electronic, and magnetic properties. For example, as device scaling continues in the existing silicon-based complementary metal oxide semiconductor (CMOS) industry, $SiO_2$ is approaching its fundamental limits as the gate dielectric. Alternative gate materials with higher dielectric constants than $SiO_2$ are needed. The alkaline earth metal oxide of $SrTiO_3$ (STO) is a promising material for this purpose because of its high bulk dielectric constant. However, direct growth of this oxide on Si is especially difficult because Si is highly reactive with oxygen, forming amorphous $SiO_2$, or glassy silicates. Additionally, extensive interdiffusion or chemical reactions can degrade the properties of the oxide and/or the underlying silicon. It is therefore critical to produce a stable interfacial template on Si that sustains high temperatures in an oxygen environment for the subsequent single-crystal film growth.

A method of growing the alkaline earth metal oxide of $BaTiO_3$ (BTO) on Si has been reported by McKee et al (1) (Appl. Phys. Lett. 59 (7) p. 782–784, Aug. 12, 1991). The high temperature method includes first reacting Ba metal with a clean Si surface at a temperature greater than 840° C. to form a (2×1) barium silicide submonolayer. The authors state that this barium silicide (discussed in detail by Make, R. A. and Walker, F. J., Appl. Phys. Lett. 63 (20), p. 2818–2820, Nov. 15, 1993) plays a critical role as an interfacial template between silicon and the subsequently epitaxially-grown oxide layers of BaO and BTO. Make et al (1) report growing a BaO layer on this template at temperatures ranging from room temperature to 800° C. by the simultaneous or cyclic exposure of the barium silicide film to Ba metal and oxygen at partial pressures of $10^{-7}$ Torr to $10^{-4}$ Torr and that "the cyclic growth conditions are most important in optimizing the surface and film quality." BTO is then grown on this BaO layer by the shuttering of Ti and Ba cells at one monolayer intervals in an oxygen partial pressure of $2.5\times10^{-7}$ Torr.

U.S. Pat. No. 5,482,003 (Mckee and Walker) similarly discloses a high temperature method for depositing an epitaxial layer of alkaline earth oxide upon another layer having an ordered face-centered-cubic lattice structure (e.g., Si) or an alkaline earth oxide having a sodium chloride-type lattice structure (e.g., BaO, SrO, CaO, and MgO). The method includes the steps of cleaning a silicon substrate using the Modified RCA technique, forming a stable silicide layer by depositing a submonolayer of a mixture of Ba and Sr at a temperature greater than 850° C. in an ultrahigh vacuum, oxygen-free environment ($10^{-10}$ Torr to $10^{-9}$ Torr), lowering the temperature to between 200° C. and 300° C. at which point a further mixture of Ba and Sr is deposited until the surface is covered by about one monolayer of the metal mixture, then increasing the pressure of the ultrahigh vacuum to between $1\times10^{-6}$ Torr to $5\times10-6$ Torr with the introduction of oxygen and then exposing the metal-covered surface to this oxygen and additional amount of the metal mixture to epitaxially grow alkaline earth metal oxide on the silicon surface. Further layers of oxide are subsequently grown on this layer. A similar method for growing STO on Si (100) has also been reported by Mckeee et al (2) (Phys. Rev. Lett. 81 (14), p. 3014–3017, Oct. 5, 1998).

A method of growing STO on Si has been reported by Eisenbeiser et al (Appl. Phys. Lett. 76 (10) p. 1324–1326, Mar. 6, 2000) and Yu et al (1) (Mater. Res. Soc. Symp. Proc. 567 p.427–433, 1999). Eisenbeiser et al discloses a method using lower temperatures and having fewer steps than the Make et al methods. In Eisenbeiser et al, metallic Sr was reacted with the silicon oxide on the surface of a silicon substrate at a temperature greater than 700° C. under high vacuum to produce a 2×1 surface reconstruction. STO was subsequently directly grown on this layer in the temperature range of 200° C. to 800° C. and up to $10^{-5}$ Torr oxygen partial pressure.

Yu et al (2) (J. Vac. Sci. Technol. B 18 (4) p. 2139–2145, July/August 2000) further reports a similar low temperature method of growing STO or BTO on Si. Yu et al (2) discloses a method whereby metallic Ba or Sr was reacted with as-received commercial Si(001) wafers at a temperature below 800° C. at a pressure below mid-$10^{-10}$ Torr. BTO and STO films were subsequently deposited at a temperature in the range of 200° C. to 700° C. under up to $10^{-5}$ Torr oxygen partial pressure. U.S. Pat. No. 6,113,690 (Yu et al) discloses another similar method whereby an alkaline earth metal, preferably Ba or Sr, was reacted with a silicon substrate having a silicon dioxide layer at a temperature in the range of 700° C. to 800° C. and a pressure in the range of $10^{-10}$ Torr to $10^{-9}$ Torr.

U.S. Pat. No. 6,022,410 (Yu et a) discloses a low temperature method of forming an ordered Si wafer surface for subsequent thin film epitaxy. The low temperature method includes reacting atomic beams of one or more alkaline earth metals and an atomic beam of Si with a clean Si surface at a temperature in the range of 500° C. to 750° C. to form a single crystal alkaline earth metal silicide layer (e.g., $BaSi_2$) on the surface of the silicon substrate.

Accordingly, there is a need for a simplified process that produces a high quality, crystalline oxide structure for semiconductor applications as well as for other electronic, optical, and magnetic applications.

BRIEF SUMMARY OF THE INVENTION

The present invention encompasses a stable oxidized film structure and an improved method of making such a structure, including an improved method of making an interfacial template for growing a crystalline metal oxide structure. The improved method comprises the steps of providing a substrate with a clean surface and depositing a metal on the surface at a high temperature while under a vacuum to form a metal-substrate compound layer on the surface with a thickness of less than one monolayer. The compound layer is then oxidized by exposing the compound layer to essentially oxygen at a low partial pressure and low temperature. The method may further comprise the step of annealing the surface while under a vacuum to further stabilize the oxidized film structure. A crystalline metal oxide structure may be subsequently epitaxially grown by using the oxidized film structure as an interfacial template and depositing on the interfacial template at least one layer of a crystalline metal oxide.

It is an object of the present invention to provide an improved method for making a high quality, robust, and stable oxidized film structure.

It is a further object of the present invention to provide an interfacial template and an improved method for preparing the interfacial template that can sustain high temperatures in an oxygen environment for subsequent epitaxial growth of a crystalline metal oxide structure.

It is a further object of the present invention to provide an improved method for producing an alkaline earth metal oxide structure that can function as a gate material with a higher dielectric constant than $SiO_2$ for semiconductor applications.

It is a further object of the present invention to provide an improved method for producing an alkaline earth metal oxide structure incorporating a silicon substrate.

It is a further object of the present invention to provide an epitaxy method that can be routinely performed in conventional processing systems or growth chambers.

It is a further object of the present invention to provide an epitaxy method that can be conveniently scaled-up.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

FIG. 2 is a simplified sectional view of a crystalline metal oxide structure formed by depositing a metal oxide on the oxidized film structure of FIG. 1a.

FIG. 3a is an LEED pattern of a strontium silicide-(2×1) layer formed in accordance with the present invention.

FIG. 3b is an LEED pattern of the surface of the oxidized film structure formed from the strontium silicide structure of FIG. 3a in accordance with the present invention.

DETAILED DESCRIPTION OF THE INVENTION

Figure 1A:
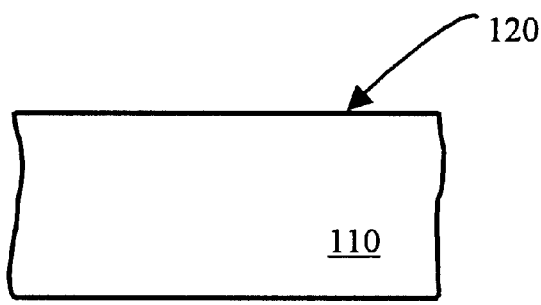
FIG. 1a is a simplified sectional view of a substrate having a clean surface.
Figure 1B:
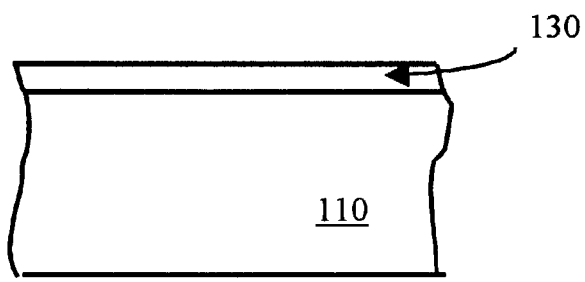
FIG. 1b is a simplified sectional view of the substrate of FIG. 1a whereupon a metal has been deposited to form a metal-substrate compound layer.
Figure 1C:
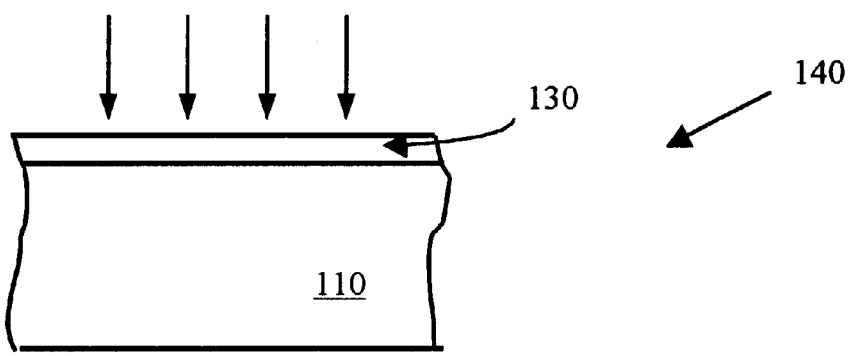
FIG. 1c is a simplified sectional view of the metal-substrate compound layer being exposed to a low partial pressure of oxygen to produce a stable oxidized film structure that can be used as an interfacial template for growing a crystalline metal oxide structure.

Embodiments of the present invention encompass a stable oxidized film structure and improved method of making such a structure, including an improved method of making an interfacial template for growing a crystalline metal oxide structure. The present invention is schematically illustrated in FIGS. 1a–c and comprises the steps of providing a substrate 110, made from Si, Ge, or combinations thereof, with a clean surface 120. The substrate may be a semiconductor material. "Clean" surface is defined herein as a surface that is essentially free of surface contamination, particularly less than 0.5% C and O atoms on the surface. As is known to those skilled in the art of epitaxial structures, any metal may be chosen that is epitaxially compatible with the clean surface 120, for example Sr, Ba, Mg, Ca, and combinations thereof in the case of a substrate 110 having a face-centered-cubic structure such as Si. The metal is subsequently deposited on the clean surface 120 by any of a variety of known deposition methods, including molecular-beam epitaxy (MBE), chemical vapor deposition (CVD), and e-beam evaporation, at a temperature of at least 750° C. while under a vacuum in which the pressure is less than $1\times10^{-8}$ Torr, preferably less than $3\times10^{-9}$ Torr, to form a metal-substrate compound layer 130 on the surface with a thickness of less than one monolayer (FIG. 1b). The compound layer 130 is then oxidized by exposing the compound layer 130 to essentially oxygen at a partial pressure in the range of $1\times10^{-8}$ to $1\times10^{-6}$ Torr at a temperature in the range of 25° C. to 200° C. (FIG. 1c) to form an oxidized film structure 140. The oxidized film structure 140 comprises a monolayer of the oxidized compound layer 130 on the substrate 110 and may be used as an interfacial template for subsequent growth of a crystalline metal oxide structure. The method may further comprise the step of annealing the surface of the oxidized film structure 140 while under a vacuum in which the pressure is less than $1\times10^{-8}$ Torr, preferably less than $5\times10^{-9}$ Torr, to further stabilize the oxidized film structure 140. Such annealing may be performed prior to, or concurrently with, any subsequent crystalline metal oxide deposition.

FIG. 2 shows another embodiment of the present invention whereby a crystalline metal oxide structure 200 incorporates such an oxidized film structure 140 as an interfacial template. The crystalline metal oxide structure 200 is made by providing the oxidized film structure 140 and then depositing on the oxidized film structure 140 at least one metal oxide layer 150 using any of a variety of known methods including MBE, CVD, and e-beam evaporation. The at least one metal oxide layer 150 may comprise, but is not limited to, SrO, $SrTiO_3$, BaO, $BaTiO_3$, $Ba_{1-x}$, $SrTiO_3$, and combinations thereof. Furthermore, in cases whereby more than one metal oxide layer 150 is deposited on the oxidized film structure 140, each layer may comprise a different metal oxide (e.g., an oxidized film structure 140 with a deposited BaO layer thereon followed by a deposited $BaTiO_3$ layer).

EXAMPLE

A substrate 110 of silicon was provided by a commercial epi-ready Si(001) wafer that was covered by a layer of native $SiO_2$. To obtain a clean surface 120, the wafer was first degreased in acetone and methanol, rinsed in deionized water, and blow-dried before loading into an ultrahigh vacuum (UHV) chamber. The wafer was then heated to above the sublimation temperature of $SiO_2$ (>850° C.). The pressure of the UHV chamber during the heating was kept under $3\times10^{-9}$ Torr to prevent the surface from being contaminated by carbon, as judged by x-ray photoelectron spectroscopy (XPS). The surface of the substrate 110 was confirmed to be clean by confirming the surface structure to be Si(001)-(2×1) reconstruction by low energy electron diffraction (LEED) and scanning tunneling microscopy (STM). Alternatively, a clean surface 120 can be obtained from a hydrogen passivated Si(100) surface which is covered by a layer of hydrogen instead of a native $SiO_2$ layer. A clean surface 120 may be obtained from a hydrogen passivated surface by heating the surface to ~400° C. The heating process removes the surface hydrogen and results in a reconstructed Si(100)-(2×1) surface.

After the clean surface 120 was obtained on the substrate 110, a layer of Sr was deposited on the clean surface 120 to form the metal-substrate compound layer 130 of strontium-silicide-(2×1) of less than 1 ML in thickness. The deposition temperature may vary between 750° C. and 850° C., depending on the exact flux used for the deposition. At higher temperatures, higher fluxes are required. For example, at a deposition temperature of 780° C., a flux of 0.06–0.1 Å/s was used, while at 820° C., 0.1–0.16 Å/s was used. The key was to balance the flux and temperature to yield the strontium-silicide(2×1) structure. The strontium-silicide-(2×1) structure was confirmed by LEED (FIG. 3a) and the presence of Sr was verified by XPS and Rutherford Backscattering Spectroscopy. Although the strontium-silicide-(2×1) structure can also be obtained by depositing Sr on the clean surface 120 and then desorbing excess Sr from the resulting surface, the surface produced by the latter method was less favorable for subsequent growth of metal oxides. STM of the latter surface showed poor uniformity resulting from this process.

Once the strontium-silicide-(2×1) surface was prepared, this surface was exposed to up to 100 L (1 L=$10^{-6}$ Torr.sec) molecular oxygen (approximately the $10^{-8}$ Torr to $5\times10^{-7}$ Torr range) at 25° C. to 200° C. The choices of oxygen pressure and temperature conditions were aimed at preventing oxygen diffusion into the underlying Si layers. It is anticipated that oxygen pressures as high as $10^{-6}$ Torr may be used at the lower end of this temperature range. The oxygen pressure was achieved by back-filling the chamber using a leak valve and it was pumped out quickly after the oxidation. The resulting oxidized film structure 140 was then annealed in UHV without the presence of oxygen (<$5\times10^{-9}$ Torr) at 400° C. to 500° C. for five to ten minutes. As illustrated in FIG. 3b, LEED revealed a sharp (2×1) pattern for the oxidized film structure 140, which was comparable to that of the surface before the oxidation step, as illustrated in FIG. 3a. This demonstrated that the formed oxidized film structure 140, used as an interfacial template, was of high quality crystalline phase.

Figure 4:
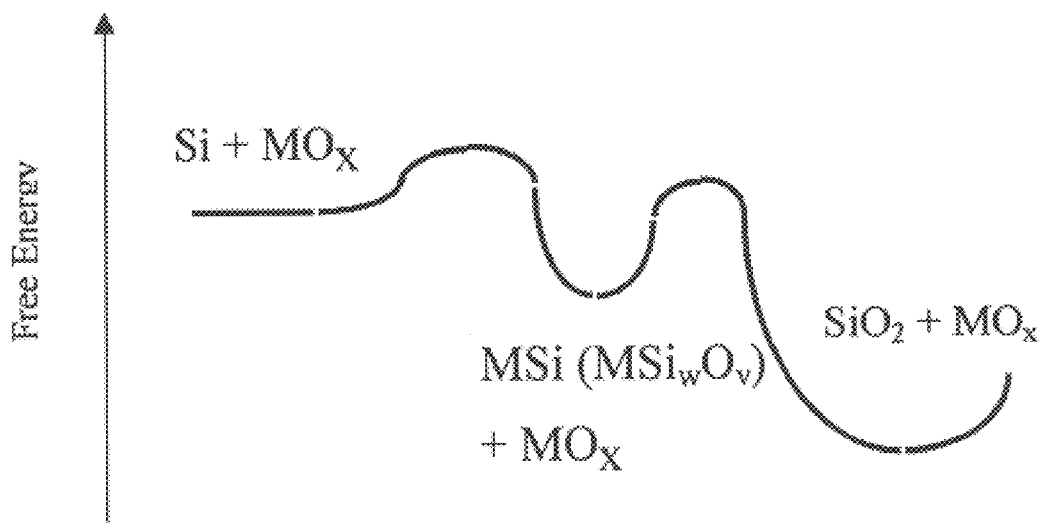
FIG. 4 is a simplified thermodynamic chart showing the basis for the stability of the oxidized film structure.

Furthermore, the oxidized film structure 140 is thermodynamically stable by creating a local free energy minimum of the (Sr, Si, O) system as shown in FIG. 4. This local minimum is contrasted to the global minimum that is represented by $SiO_2$. Since the clean Si surface is highly reactive and often forms an amorphous $SiO_2$ layer upon exposure to oxygen, any attempt to grow a single-crystal metal oxide ($MO_x$) on a Si surface must first avoid the formation of the $SiO_2$ layer. From a thermodynamics point of view, since $SiO_2$ is a highly stable phase, formation of $SiO_2$ layer on Si is a natural process of energy minimization. It is possible, however, that the formation of $SiO_2$ on Si can be avoided by introducing a metal silicide (MSi) or metal silicate ($MSi_wO_y$) layer on a Si surface. As long as the induced energy minimum is deep enough and the silicide or silicate layer is structurally compatible with the metal oxide, single-crystal $MO_x$ films can be grown on Si without the formation of $SiO_2$ layer.

Figure 5:
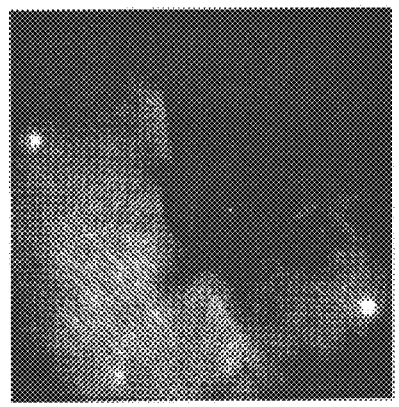
FIG. 5 is an LEED pattern of the surface of an as-grown SrO structure formed on the oxidized film structure in accordance with the present invention.
Figure 6:
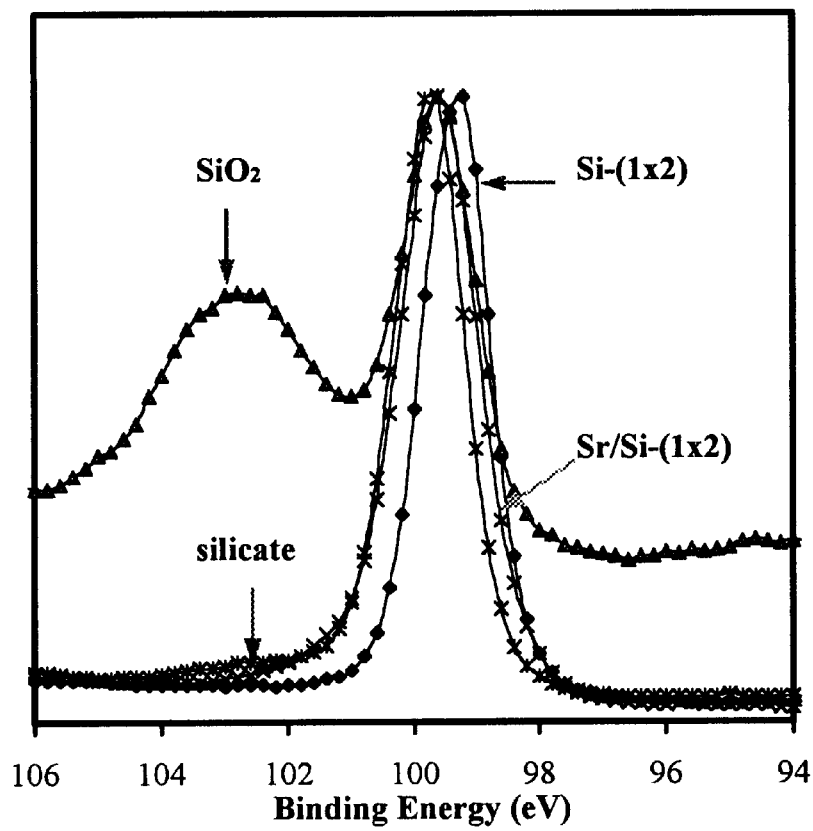
FIG. 6 is an x-ray photoelectron spectrum of Si 2p peak of the interface of 2 ML SrO on Si(001) formed in accordance with the present invention compared with that of silica, silicide, and clean silicon.
Figure 7:
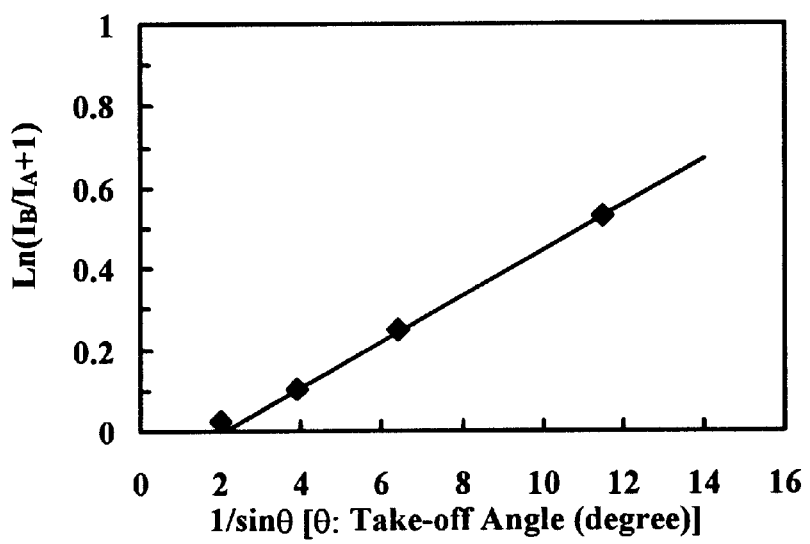
FIG. 7 illustrates angular-dependent XPS results of the oxidized film structure formed in accordance with the present invention.

The oxidized film structure 140 of the present invention can thus sustain relatively high temperatures in an oxygen environment and therefore can be used for the subsequent growth of one or more metal oxide layers 150 to form a crystalline metal oxide structure 200. A crystalline metal oxide structure 200 was formed in accordance with the present invention by depositing an SrO film on the oxidized film structure 140 described in the preceding paragraphs. FIG. 5 is an LEED pattern of a 20 Å thick SrO film grown at 470° C. on such a stable interfacial template. The degrading of the LEED pattern is due to the large lattice mismatch between SrO and Si. The (1×1) LEED pattern demonstrated that the SrO film was single-crystal. Using XPS, the interface between the SrO film and the silicon substrate was determined to be strontium silicate, not silica ($SiO_2$), as illustrated in FIG. 6. This was judged from Si 2p peak position in the XPS spectra. A binding energy of 103.5 eV corresponds to Si 2p peak of silica, while 100 eV indicates strontium silicide and clean silicon (see, for example, Fundamental Aspects of Ultrathin Dielectrics on Si-based Devices, E. Garfunkel, E. Gusev, A. Vul, Nano Science Series 3/47, 1998, Kluwer Academic Publishers). The Si 2p peak for strontium silicate appears at between 100 eV and 103 eV. Using the angular-dependent XPS method, as illustrated in FIG. 7 (see, for example, Practice Surface Analysis, D. Briggs and M. P. Seah, John Wiley & Sons, 1990), the thickness of the interfacial layer was determined to be 1.7 Å, smaller than the height of one atomic layer of SrO. This indicates that the oxidized film structure 140 is uniformly distributed within one atomic layer.

The oxidized film structure 140 described in this example provided a stable interfacial template for the growth of crystalline strontium oxides on the substrate 110 of silicon. Under the growth conditions (up to 500° C. and with an oxygen partial pressure of ~$10^{-7}$ Torr), the interfacial template was stable and did not form amorphous silica. As is known to those skilled in the art, this process may be broadened to include, but is not limited to, the deposition of the alkaline earth metal oxides of SrO, $SrTiO_3$, BaO, $BaTiO_3$, $Ba_{1-x}Sr_xTiO_3$, and combinations thereof. The process described here forms the basis for technological development of perovskite oxide-based high-dielectric constant materials on silicon and fabrication of metal-oxide-semiconductor (MOS) capacitors using these materials as alternative gate oxides to $SiO_2$.

Closure

Accordingly, improved methods have been disclosed that produce a robust and stable oxidized film structure that may be used as an interfacial template for the growth of crystalline metal oxides. The oxidized film structure can sustain high temperature annealing in an oxygen environment and may be used during the subsequent growth of metal oxides and thus prevent the formation of amorphous structures. Furthermore, the process is compatible with conventional UHV systems that could be transferred to scaled-up processing for perovskite oxide-based high-dielectric constant materials on substrates for CMOS technology.

While embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A method of making a stable oxidized film structure, comprising the steps of
providing a substrate with a clean surface, wherein said substrate comprises a material selected from the group consisting of Si, Ge, and combinations thereof;
depositing a metal on said clean surface at a temperature of at least 750° C. under a vacuum in which the pressure is less than $1 \times 10^{-8}$ Torr to form a metal-substrate compound layer on said clean surface with a thickness of less than one monolayer; and
oxidizing said metal-substrate compound layer to form a monolayer of an oxidized film on said substrate by exposing said metal-substrate compound layer to a gas consisting essentially of oxygen at a pressure in the range of $1 \times 10^{-8}$ to $1 \times 10^{-6}$ Torr at a temperature in the range of 25° C. to 200° C.

2. The method as recited in claim 1, further comprising the step of annealing said oxidized film in a vacuum in which the pressure is less than $1 \times 10^{-8}$ Torr.

3. The method as recited in claim 2, wherein said annealing is performed at a temperature in the range of 400° C. to 500° C.

4. The method as recited in claim 1, wherein said substrate comprises silicon.

5. The method as recited in claim 1, wherein said deposition is performed at a temperature in the range of 750° C. to 850° C.

6. A method of making an interfacial template for growing a crystalline metal oxide structure, comprising the steps of
providing a substrate with a clean surface, wherein said substrate comprises a material selected from the group consisting of Si, Ge, and combinations thereof;
depositing a metal selected from the group consisting of Sr, Ba, Mg, Ca, and combinations thereof on said clean surface at a temperature of at least 750° C. under a vacuum in which the pressure is less than $1 \times 10^{-8}$ Torr to form a metal-substrate compound layer on said clean surface with a thickness of less than one monolayer; and
oxidizing said metal-substrate compound layer to form a monolayer of an oxidized film on said substrate by exposing said metal-substrate compound layer to a gas consisting essentially of oxygen at a pressure in the range of $1 \times 10^{-8}$ to $1 \times 10^{-6}$ Torr at a temperature in the range of 25° C. to 200° C.

7. The method as recited in claim 6, further comprising the step of annealing said oxidized film in a vacuum in which the pressure is less than $1 \times 10^{-8}$ Torr.

8. The method as recited in claim 7, wherein said annealing is performed at a temperature in the range of 400° C. to 500° C.

9. The method as recited in claim 6, wherein said deposition is performed at a temperature in the range of 750° C. to 850° C.

10. A method of making a crystalline alkaline earth metal oxide structure, comprising the steps of:
making an interfacial template in accordance with claim 6; and
depositing on said interfacial template at least one layer of an alkaline earth metal oxide.

11. The method as recited in claim 10, wherein said alkaline earth metal oxide is selected from the group consisting of SrO, SrTiO$_3$, BaO, BaTiO$_3$, B$_{1-x}$Sr$_x$TiO$_3$ where x is a number between 0 and 1, and combinations thereof.

12. The method as recited in claim 10, wherein there are at least two layers of an alkaline earth metal oxide and adjacent layers are of a different alkaline earth metal oxide.

* * * * *